(12) United States Patent
Schulz-Harder et al.

(10) Patent No.: US 7,528,470 B2
(45) Date of Patent: May 5, 2009

(54) CONDUCTOR BOARD AND METHOD FOR PRODUCING A CONDUCTOR BOARD

(75) Inventors: Jurgen Schulz-Harder, Lauf (DE); Andreas Meyer, Eschenbach (DE)

(73) Assignee: Curamik Electronics GmbH, Eschenbach (DE)

( * ) Notice: Subject to any disclaimer, the term of this patent is extended or adjusted under 35 U.S.C. 154(b) by 606 days.

(21) Appl. No.: 11/292,656

(22) Filed: Dec. 2, 2005

(65) Prior Publication Data

US 2006/0117561 A1 Jun. 8, 2006

Related U.S. Application Data

(60) Division of application No. 10/750,617, filed on Dec. 31, 2003, now Pat. No. 7,000,316, which is a continuation-in-part of application No. 09/663,253, filed on Sep. 15, 2000, now abandoned.

(30) Foreign Application Priority Data

Sep. 15, 1999 (DE) .................................. 199 44 102
Sep. 24, 1999 (DE) .................................. 199 45 794

(51) Int. Cl.
H01L 23/02 (2006.01)
(52) U.S. Cl. .......................................... 257/678; 29/882
(58) Field of Classification Search ................. 257/678; 29/882
See application file for complete search history.

(56) References Cited

U.S. PATENT DOCUMENTS

| 3,171,756 | A | * | 3/1965 | Marshali ..................... 428/137 |
| 4,959,507 | A | * | 9/1990 | Tanaka et al. ............... 174/260 |
| 5,054,192 | A | * | 10/1991 | Cray et al. .................... 29/835 |
| 5,317,801 | A | * | 6/1994 | Tanaka et al. ................. 29/830 |
| 5,561,321 | A | * | 10/1996 | Hirano et al. ............... 257/700 |
| 5,676,855 | A | * | 10/1997 | Schulz-Harder ............. 216/52 |
| 6,071,592 | A | * | 6/2000 | Sakuraba et al. ............ 428/141 |
| 6,634,100 | B2 | * | 10/2003 | Akram et al. .................. 29/874 |
| 7,000,316 | B2 | * | 2/2006 | Schulz-Harder et al. ...... 29/882 |

* cited by examiner

Primary Examiner—Roy K Potter

(57) ABSTRACT

The conductor board has at least one layer of a dielectric provided areally on two mutually opposed faces with at least one metalization on each. There is at least one through contacting in the region of an aperture. The metalizations are applied to cover at least one aperture and are electrically connected to each other through the aperture.

30 Claims, 5 Drawing Sheets

Fig. 1
a
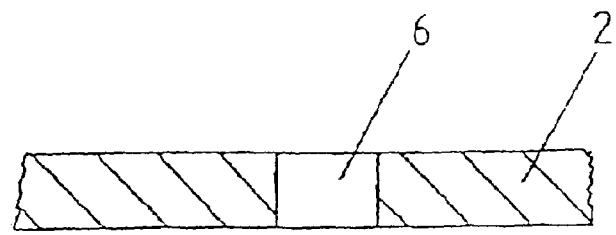
b
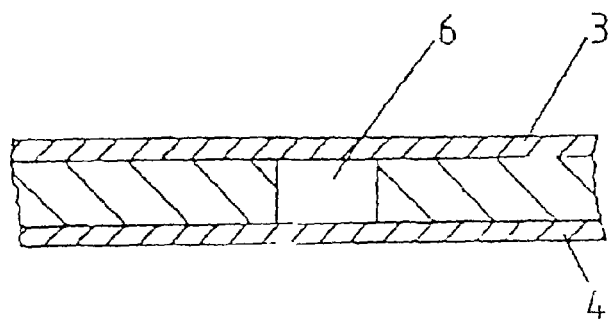
c
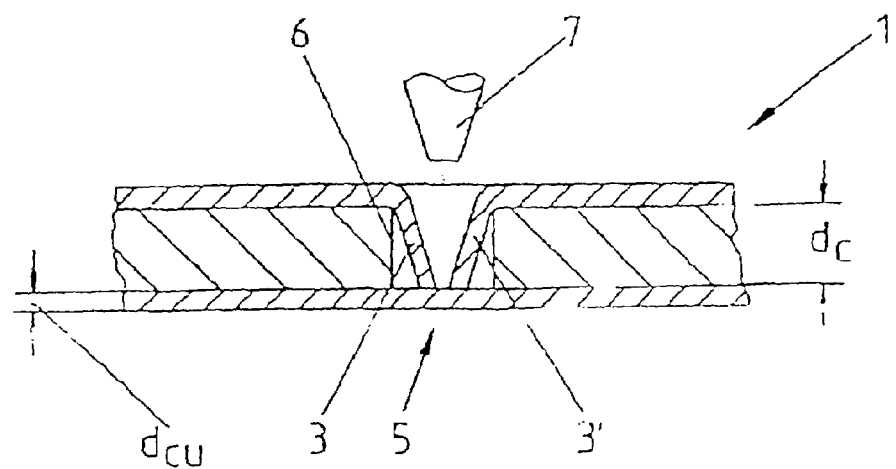

Fig. 2
a
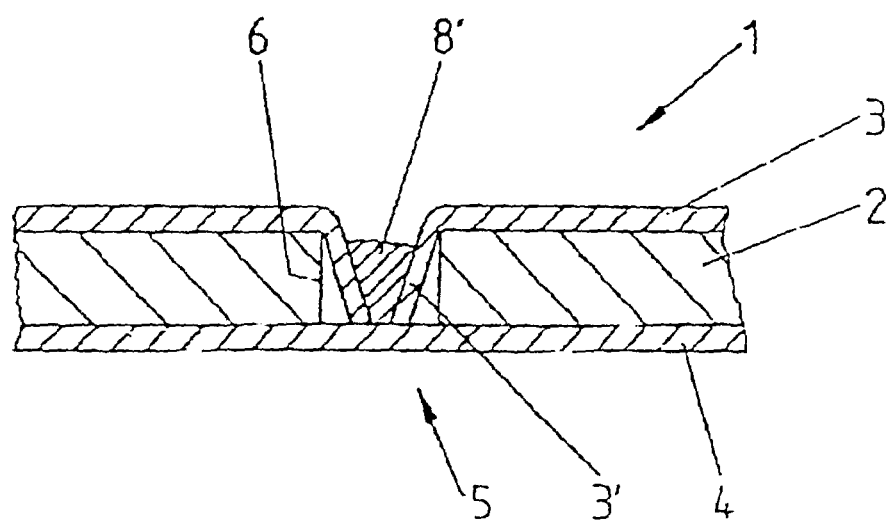
b
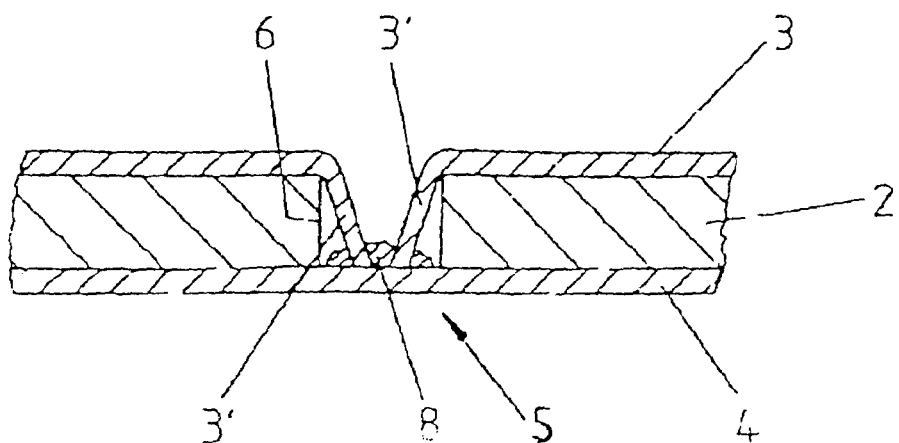

Fig. 4
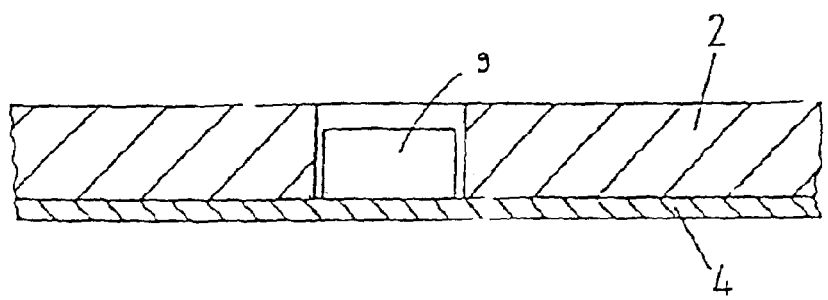
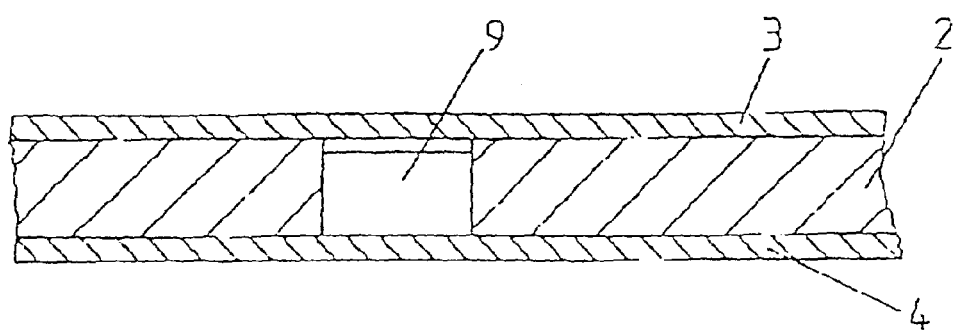
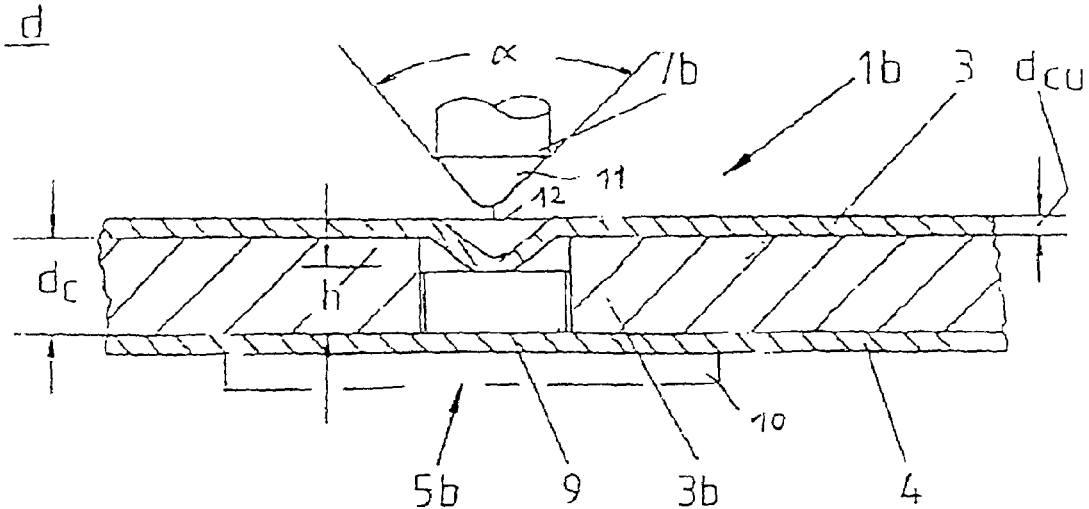

Fig. 5
a
b
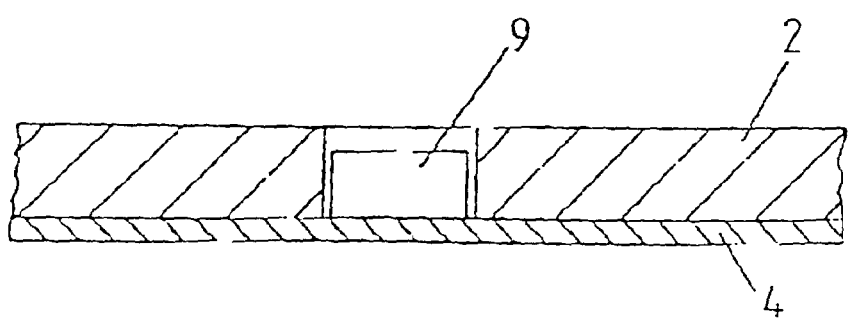
c
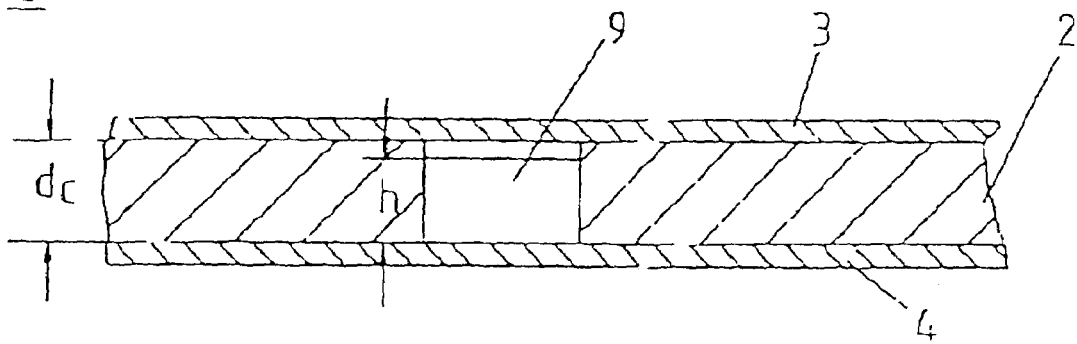
d
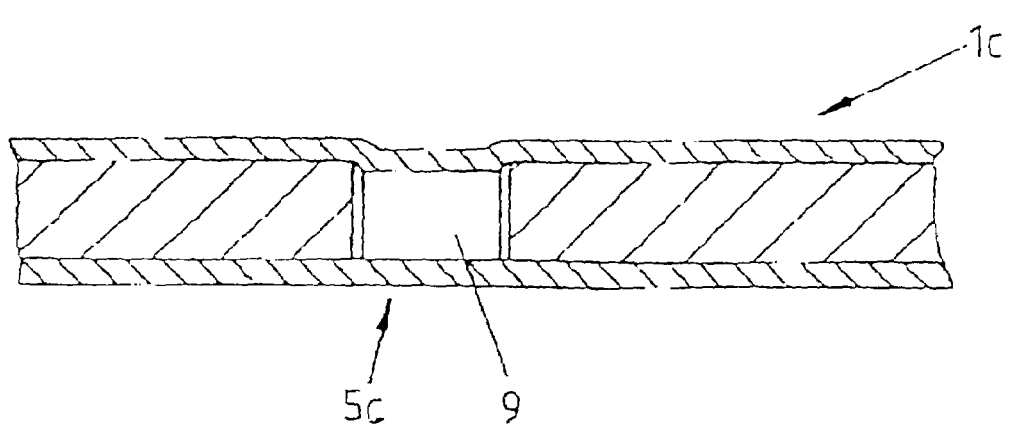

CONDUCTOR BOARD AND METHOD FOR PRODUCING A CONDUCTOR BOARD

CROSS-REFERENCE TO RELATED APPLICATIONS

This Application is a Divisional of U.S. application Ser. No. 10/750,617 filed Dec.31, 2003, now U.S. Pat. No. 7,000, 316, which, in turn, was a Continuation-in-part of U.S. patent application Ser. No. 09/663,253, filed on Sep. 15, 2000 now abandoned.

BACKGROUND OF THE INVENTION

1. Field of the Invention

This Invention relates to a method for producing a conductor board and to a conductor board produced thereby.

2. Description of Related Art

It is known that the metalization required to produce conductor paths, connections, etc. may be produced on a ceramic, e.g. an aluminum oxide ceramic, by the so-called "direct bonding technology", and in the case of copper metalizations, by the so-called "DCB process", (direct copper bonding technology), to wit using metal or copper foils or sheets forming the metalization, that comprise a layer or coating of the metal and a reactive gas, preferably oxygen, on their faces.

In this process, described for example in U.S. Pat. No. 3,711,120 or German Patent 2,319,854, the layer or coating of the chemical compound of the metal and a reactive gas (fusion-applied layer) forms a eutectic having a melting temperature below the melting temperature of the metal (e.g. copper), so that by applying the foil to the ceramic and by heating all layers, these can be joined together, to wit by melting on of the metal, or copper, substantially only in the region of the melt-on or oxide layer.

The DCB process comprises, for example, the following steps:

Oxidizing a copper foil in such manner that a uniform Copper oxide layer results Placing the copper foil on the ceramic layer Heating the composition to a processor temperature between about 1065 and 1083° C., e.g. to about 1071° C.

Cooling to room temperature.

Likewise, a so-called active soldering process, ("diffusion soldering method") is known for joining metal to carbide ceramics (German Patent 2,213,115). In this known method, an active solder is employed between the metal and the ceramic. The solder has an active metal whose enthalpy of binding to the ceramic is at least 50% of the binding enthalpy of the ceramic in question, so that upon heating to 800-1000° C., not only a joining of the solder to the metalization is achieved, but the active metal contained in the solder also forms binding bridges with the carbide, or ceramic.

There is also a known method of producing a substrate (European Patent 0,627,875) in which, in order to produce a through contacting, i.e. an electrical connection between an upper and a lower metalization within the compass of the substrate, a metal body is placed in an aperture of the insulation layer, and then the body is deformed by pressing, to the thickness of the insulating layer. To complete the through contacting, an electrical connection or bonding is done between the inserted metal body and the metalizations formed by metal foils or coatings. This connection or bonding is done, for example, by the DCB process.

A disadvantage of these known methods is that the bonding takes place at elevated process temperature, and the metal body undergoes a substantially greater thermal expansion than the insulating layer, so that upon bonding, the metalizations lift off the insulating layer at the margin of the particular aperture. Therefore, even after production of the substrate, the metallization in the immediate surroundings of the through contacting are not completely connected to the faces of the insulating or ceramic layer.

SUMMARY OF THE INVENTION

The object of the Invention is to provide a method for avoiding these disadvantages thereby obtaining an improved conductor board. To accomplish this object, a conductor board, in particular for electric or electronic circuits, is configured having at least one layer of ceramic provided areally on two mutually opposed faces with at least one metalization each and comprising at least one through contacting (through contact) in the region of an aperture. Metal foils, for example copper foils, are applied to—the ceramic faces using a direct copper bonding (DCB) technique or by active soldering. The foils form the metallization and cover at least one aperture, and the metalizations are electrically connected to each other through the aperture. The present Invention is characterized in that only one of the metalizations is permanently deformed in the region of the aperture in such a manner that it forms a segment extending into the aperture, and that segment is electrically connected to the other metalization in the region of the aperture, thereby forming a through contacting.

The present Invention is further characterized in that a body of electrically conductive material, preferably a metal body, is inserted in the aperture whose height (h) is smaller than the thickness ($d_c$) of the layer of the dielectric (ceramic), in that at least one metallization is so deformed that both metalizations lie in contact with the metal body in the region of the aperture, and in that the metalizations are electrically connected to the metal body.

The present Invention produces a conductor board, in particular for electric or electronic circuits, having at least one layer of—a dielectric, preferably of ceramic, areally provided on two mutually opposed faces with at least one metalization each and comprising at least one through contacting in the region of an aperture. Metal foils, for example copper foils, are applied to said faces, preferably using the DCB technique or by active soldering. The foils form the metalizations and cover at least one aperture. A body of electrically conductive material is inserted in the aperture and electrically connected to the metalizations. The present Invention is characterized in that the height (h) of the metal body is smaller than the thickness ($d_c$) of the layer of the dielectric, and in that at least one metalization is so deformed that both metalizations lie in contact with the metal body in the region of the aperture.

Preferably, the body inserted in the at least one aperture has a height (h) satisfying the following conditions:

$$h < d_c[(1+(\alpha_1-\alpha_2)\Delta T] + K$$

wherein dc is the thickness of the layer (2) of the dielectric;

$\alpha_1$ is the coefficient of thermal expansion of the material of the layer (2) of the dielectric;

α2 is the coefficient of thermal expansion of the material of the inserted body (9);

ΔT is the temperature difference between the maximum process temperature used in electrically connecting and room temperature;

K is a correction factor.

The present Invention is further characterized in that only one of the two metalizations is deformed.

BRIEF DESCRIPTION OF THE DRAWINGS

The Invention will be illustrated in more detail by way of example and with reference to the drawings wherein:

FIG. 1, in various positions, shows the steps of a method of producing a conductor board or substrate with a through contacting;

FIG. 2, in various positions, shows steps in the method of FIG. 1 for electrical connection in producing the through contacting;

FIG. 4 shows various steps of another embodiment of the method according to the Invention; and FIG. 5 shows steps of a method similar to FIG. 4.

DETAILED DESCRIPTION OF THE INVENTION

Figure 3:
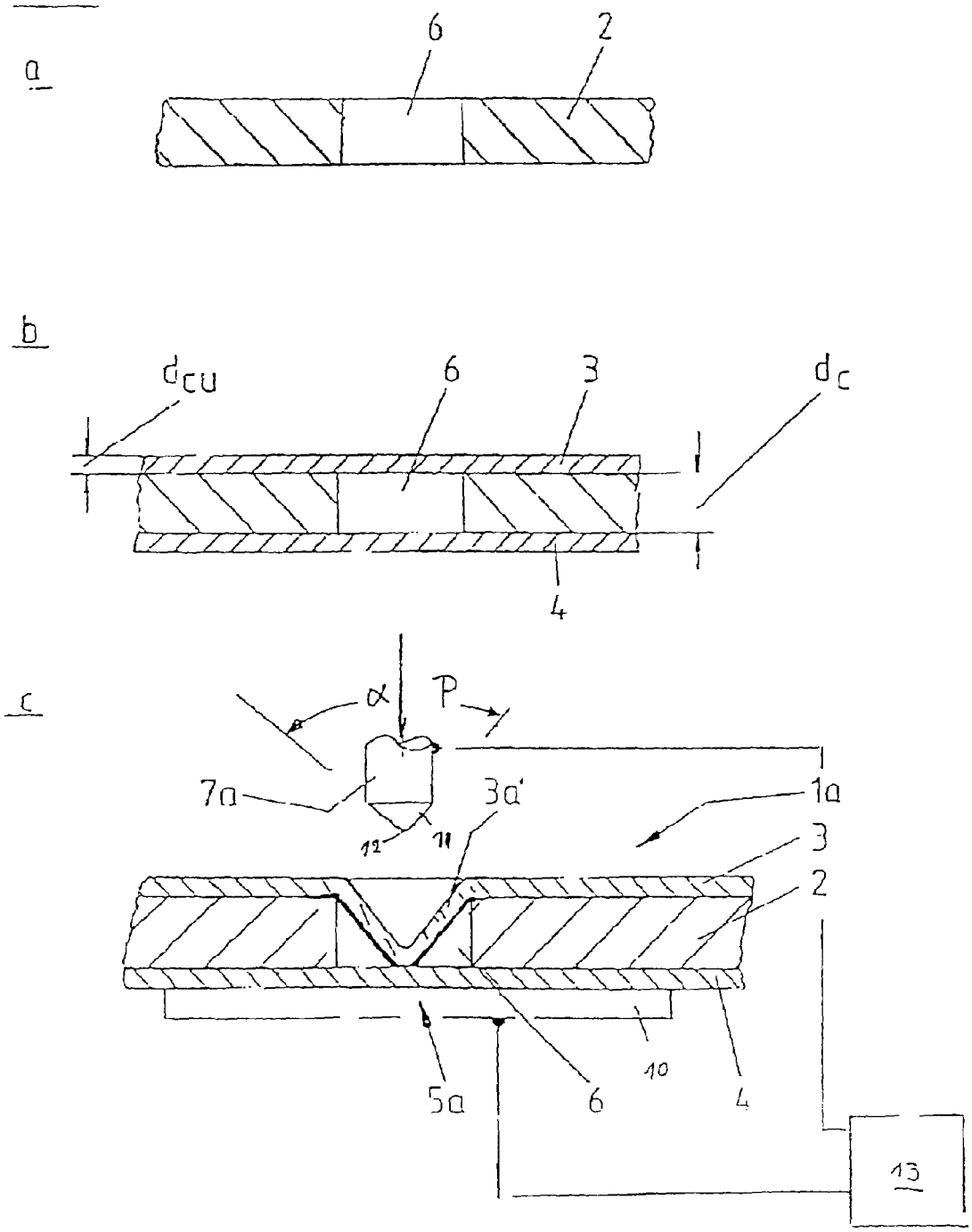
FIG. 3, in representations similar to FIG. 1, shows an additional possible embodiment of the method.

FIG. 1, in position c, shows a conductor board or substrate 1 in partial sectional view, intended for electric circuits or components and consisting essentially of a board or plate 2 of a dielectric or insulating material, for example of ceramic or some other suitable insulating material such as conductor board material, and provided on top with a metalization 3 and underneath with a metallization 4. Each of the two metalizations 3 and 4 is areally connected to the layer 2. At least one of the metalizations 3 and 4 is structured for the formation of conductor paths, contact surfaces, connections, etc. using known techniques, as for example masking and etching techniques.

The substrate 1 has at least one through contacting 5, i.e. a through contact, an area at which the upper metalization 3 is electrically connected to the lower metalization 4, which is within the compass of the substrate 1. The production of the substrate 1 with through contacting 5 takes place in accordance with the steps represented in FIG. 1. First the layer 2 of dielectric is furnished with a screw aperture 6. Then, on both faces of the layer 2, the metalizations 3 and 4 are applied in the form of metal foils, preferably copper foils, and connected by known techniques, for example the direct bonding process or the active solder process, areally to the faces of the layer 2. The layer 2 is made of ceramic such as aluminum oxide or aluminum nitride.

After application of the metalizations 3 and 4, the aperture 6 is covered by both metalizations. Then in a further step, using suitable tool or stamp 7, the metalization 3 is permanently deformed in its region covering the aperture 6 such that metalization 3 forms a drawn-out or sleeve-like segment 3' in aperture 6 which penetrates through to the metalization 4. In a further step, segment 3' is electrically connected to the metalization 4 to complete the through contacting 5.

FIG. 2 shows one method for the production of this electrical connection. After the production of the drawn-out, sleeve-like segment 3' into the aperture 6, a solder is placed on top of the substrate 1 and formed on the metallization 3, for example in the form of a solder paste 8' The substrate 1 is then heated to a soldering temperature so that the solder 8 makes an electrical connection with the segment 3' and hence between the metalization 3 and the metalization 4, thereby producing the through contacting 5. Still other methods of producing the electrical connection are conceivable, for example using electric current (electric welding) or renewed application of the DCB process. In the latter case, the lower margin of the segment 3' enters into a direct connection with the metalization 4 surface exposed in the aperture 6. Further, the electrical connection may alternatively be produced using conductive pastes or cements hardening under the action of heat. The DCB process for producing the electrical connection between the segment 3' and the metalization 4 takes place for example in an $N_2/O_2$ atmosphere having an $O_2$ content of 5-800 ppm.

The thickness $d_c$ of the layer 2 is, for example, on the order of 0.15-2 mm. The thickness $d_{cu}$ of the metalizations 3 and 4 is, for example, on the order of 0.2-1.0 times the thickness of the layer 2. The diameter of the aperture 6 is on the order of about 0.9-10 times the thickness of the layer 2.

FIG. 3 shows, in different positions, the steps of a method for making conductor or print board or substrate 1a which is intended for electric circuits or components and consists essentially of board or plate 2 of a ceramic or insulating material, namely of ceramic, and which is provided on the top with a metalization 3 and underneath with a metallization 4. Each of the two metalizations 3 and 4 are formed by a metal foil (for example copper foil) and areally connected to the layer 2. At least one of the metalizations 3 and 4 is structured for the formation of conductor parts, contact surfaces, connections, etc. with this structuring being performed by known-techniques, as for example masking and edging techniques. The ceramic of the layer 2 is, for example, an aluminium oxide ceramic or an aluminium-nitride-ceramic.

The substrate 1a has at least one through contacting 5a, which means an area at which the upper metalization 3 is electrically connected to the lower metalization 4, and this through contacting 5a is provided within the compass of the substrate 1a.

The production of the substrate 1a with the through contacting 5a takes place in accordance with the steps represented in FIG. 3. First the layer 2 of ceramic is furnished with aperture 6 open to both faces of the layer 2. Then, on both faces of the layer 2, the metalization 3 and 4 are applied in the form of metal foils, preferably copper foils and connected to the layer 2 by the direct bonding process (DCB process) or by the active solder process areally to the faces of the layer 2.

After application of the metalizations 3 and 4, the aperture 6 is covered by both metalizations. Then, in a further step, a stamp 7a, is used to make a permanent deformation of the metalization 3 in its region covering the aperture 6. The stamp 7a is provided with a cone-shaped lower end 11 forming rounded tip 12 for example with a radius of curvature in the range between 0.05 to 1 mm. The embodiment shown in FIG. 3, the radius of curvature of the tip 12 is about 0.2 mm and the cone angle (a) is about 90°. The diameter of the stamp 7a is, for example, 3.2 mm.

The cone shape of the stamp 7a at lower end 11 which is in contact with the metalization 3 during deformation is very important for the perfect performance of the inventive method.

The material of the metalization is conically deformed in the opening 6 by cone shaped lower end 11 of the stamp 7a, with the stamp 7a being subjected to an axial force P in such a way, that the deformed cone shaped section or segment 3a penetrates through the aperture 6 such, that said segment 3a' contacts the metalization 4 with the tip of its conical shape. The metalization 4 is supported on its side opposite to the layer 2 by a flat rest 10. After deformation, the through contacting 5a is completed by an electrical welding process. During this step, the stamp 7a and the rest 10 which are made of an electrical conducting material and which are connected to a source 13 for the welding current, act as welding electrodes.

Because of the cone shaped end 11 with the rounded tip 12, section 3a' is also cone shaped with a rounded tip. When the tip of the section 3a' contacts the metalization 4 in the aperture 6, the current circuit of the welding current is closed and the welding current provides heating and melting of the metal at the tip of the section 3a' and at a small point or cross-sectional area of metalization 4, i.e. where the tip of the section 3a' abuts the metalization 4. The force P is maintained on the stamp 7a during this welding step.

As the melting of the metal of the section 3a' and the metallization 4 at the point of contact between the section 3a' and the metalization 4 increases, also the cross sectional area of the path of current at this point of transition between the section 3a' and the metalization 4 increases, so that the current density (current/cross sectional area) and also the temperature decreases at this transition or welding point, so that the welding process automatically terminates, when the" current density and the temperature generated by the current are not longer sufficient to keep the metal in a liquid state. This provides an automatic control of the welding process in such a way, that the welding process or step is automatically terminated before the metal of the section 3a' and the metalization 4 is completely liquefied over the complete thickness of section 3a' or metalization 4 and therefore before an unwanted burning through or perforation of the section 3a' and/or the metalization 4 occurs. The current of the source 13 can be easily so controlled, that a welding is obtained in a proper way without burning through.

The cone shaped end of stamp 7a provides a large cross sectional area during the welding step, so that a large cross sectional area is provided for the welding current at the transition between the stamp 7a and the metalization 3 or the section 3a' and a low current density at this transition. By this feature, the electrical losses at the transition between the end 11 and the metalization 3 are low and an unwanted melting of the metal of the metalization 3 on the transition between the stamp 7a and the metalization 3 is prohibited.

Thickness $d_c$, $d_{cu}$ and the diameter of aperture 6 of this embodiment is the same as stated before, however, in this embodiment, the diameter of aperture 6 is at least twice the thickness $d_c$ of the ceramic layer.

In the embodiment represented in FIGS. 1 to 3, for the production of the through contacting 5 or 5a, in each instance only one metalization, i.e. the upper metalization 3, is permanently deformed, while the lower metalization 4 is not deformed. For this purpose, the lower metalization 4 is supported on the side away from the insulating layer 2 by an areal rest 10, for example a rest surface of the tool comprising the stamp 7 or 7a.

This deformation of only the upper metalization 3 has the decisive advantage that a simple tool can be used, and in that, in particular for the insulating layer 2, which is preferably a ceramic layer, any excessive bending load is avoided since the substrate upon deformation of the metalization 3 is areally supported by the metalization 4 on the rest 10. However, a very substantial advantage consists in that the deformation of only the metalization 3, in the "further use of the substrate, renders the metalization 4 available throughout its surface for structuring to form conductor paths, contact surfaces, etc. This structuring may then be accomplished by known techniques, e.g. masking and etching. The metalization 4 then forms the top of such a textured substrate, while the metalization 3 forms the under side. Conductor paths, contact surfaces, etc. may thus also be provided directly at a through contacting 5 or 5a, so that a dense and compact outfitting of the substrate with components is possible.

If the metalizations 3 and 4 are applied to the insulating layer 2 by use of the DCB technique or the active soldering process, that is, by methods carried out at relatively high temperature, then this has the further advantage that these high temperatures place the copper material of the foils or layers in a soft annealed state, in which the permanent deformation of the material of the metalization 3 by means of the stamp 7 or 7a is possible with good reliability to the required depth.

FIG. 4, as a further possibility, shows the production of a substrate 1b in which the through contacting 5b is formed by a body 9 inserted in the 'aperture 6 and electrically connected to the metalizations 3 and 4. The production of the substrate 1b thus takes place in that first one of the two metalizations, for example the metalization 4, is areally applied to the layer provided with the aperture 6. Then the metal body 9 is inserted in the aperture 6, shaped for example as a sphere, cube, rectangular prism, cylinder, rhombus, etc., its dimensions being so chosen that the metal body 9 after insertion in the aperture 6 is accommodated completely, i.e. the height of the inserted metal body 9 is smaller than the thickness $d_c$ of the layer 2.

Then in another step, the additional metalization 3 is areally applied to the top of the layer 2, again for example in the form of a metal foil, e.g. using the DCB process or an active soldering process. In a further step, one of the two metalizations, for example the metalization 3, using a stamp or tool 7b, is so permanently dished into the opening 6 that the metal body 9 is in physical contact with both the metalization 3 and the metalization 4. The through contacting 5b is again completed in that the two metalizations are electrically connected to the metal body 9. This is possible for example in that the tool 7b is configured at the same time as a welding electrode, so that the electrical connection between the metal body 9 and the metalizations 3 and 4 is accomplished in the course of the deformation. In principle, however, there are still other possibilities for the electrical connection, for example using the DCB method or other "bonding" processes. The metal body is preferably one of copper.

At a preferred modification of this method an electrical welding process or welding step is performed after deformation of the metalization 3 for connecting the deformed section of the metalization 3 with the metal body 9 by electrical welding.

In this modified process, the metal body 9 in the aperture or opening 6 is connected to the metalization 4 using the DCB-process or the active soldering process, preferably during that step of process in which the metal foil forming the metalization 4 is applied to the layer 2. After the metalization 3 had been applied to the upper side of the layer 2, for example during the step of process in which the metallization 4 is applied to the layer 2 and the metal body 9 is connected to the metalization 4 or during a further step of process, the deformation of the metalization 3 and the" welding connection between the deformed section of the metalization 3 and the metal body 9 are made. For this purpose the stamp 7b and the rest 10 again act as welding electrodes. The stamp 7b is preferably provided with the cone shaped end 11, as indicated at position d of FIG. 4.

As has been said before, the dimensions of the metal body 9 are so chosen that its height h, by which the metal body after insertion in the aperture 6 is oriented perpendicular to the planes of the metalizations 3 and 4, is smaller than the thickness $d_c$ of the layer 2. The height h is preferably chosen according to the formula:

$$h < d_c[(1+(\alpha_1-\alpha_2)\Delta T] + K.$$

wherein $\alpha_1$ is the coefficient of thermal expansion of the material of layer 2;

$\alpha_2$ is the coefficient of thermal expansion of the material of the metal body 9;

$\Delta T$ is the temperature difference between the "maximum process temperature used in electrically connecting the metal layers 3 and 4 to the body 9 and room temperature;

K is a constant, or correction factor, corresponding in use of the direct bonding or the DCB process to double the thickness of layer of the particular eutectic melt-on zone occurring in that process. In the current DCB process, the correction factor is about 5-50 microns.

If the height is chosen to satisfy the foregoing conditions, then it is ensured that even at higher temperatures required for the electrical connection or bonding, for example DCB bonding, the metalizations 3 and 4 will be completely joined to the corresponding faces of the layer 2 in the marginal region of the apertures 6 as well.

FIG. 5, as a further possibility, shows a method of producing a substrate, 1c, this method being of similar configuration to the method of FIG. 4. In this method of FIG. 5, again, for example, first the metalization 4 is applied to the under side of the layer provided with the aperture 6. Then the body 9 is inserted in the aperture 6, and then, by means of the DCB process, i.e. using metalizations or foils of copper, the upper metalization 3 is produced by the DCB process, and at the same time the electrical connection, between the body 9 and the two metalizations, in that after placement of the body 9 in the aperture 6 on the top side of the layer 2, the foil forming the metalization 3 is placed, and the system is then heated to DCB process temperature in an $N_2/O_2$ atmosphere having an $O_2$ content of 5-800. ppm.

The height h of the body 9 in this embodiment is so chosen as to be only slightly smaller than the thickness $d_c$ of the layer 2. Preferably the height h in this embodiment is so chosen that it is indeed smaller than the thickness $d_c$, but at the same time, $h < d_c[(1+(\alpha_1-\alpha_2)\Delta T]+K$.

In this method according to FIG. 5 and in the adjustment of the height h according to the above conditions, it is brought about that a joining of the body 9 to the metalizations 3 and 4 is accomplished by a bonding process with action of heat, for example by the DCB process, without first requiring a deformation of a metalization with the tool or stamp 7b.

Likewise in the method illustrated in FIGS. 4 and 5, there is again only a single deformation, i.e. a deformation of the metalization 3, whereas the metalization 4 herein is supported areally on the rest 10.

In the method described above, in particular in the methods of FIGS. 4 and 5, various modifications are possible. Thus it is possible, after inserting the body 9 in the aperture 6, to apply the metalizations 3 and 4 simultaneously to the two faces of the layer 2.

Preferably, the deformation of the one metalization is effected by a stamp and the other metalization is in contact with a plane rest. At least one metallization is preferably deformed in the manner of a hollow rivetor sleeve in the region of the aperture.

The deformation of the one metalization and/or the electrical connecting preferably takes place after conclusion of the DCB process or after the active soldering, as the case may be.

The electrical connecting is preferably effected by electric, ultrasonic and/or laser welding. Electric welding is preferably effected during or immediately after the deformation of the at least one metalization, preferably with the tool employed for deformation.

Preferably, the electrical connecting is effected with the aid of a "direct bonding" process or an active soldering process. Also, preferably, the electrical connecting is effected by heating in an $N_2/O_2$ atmosphere having an $O_2$ content of 5-800 ppm upon heating to DCB-process temperature.

The electrical connecting can be effected using a solder, preferably using a solder paste. Alternatively, the electrical connecting can be effected using a conductive past, preferably a hardenable conductive paste.

The layer of dielectric preferably has a thickness in the range between about 0.15 and 2 mm.

The metalizations are preferably in the form of metal foils, e.g. copper foils, for example of thickness $d_{cu}$, equivalent to about 0.2 to 1.0 times the thickness of the insulating layer.

The aperture for the at least one through contacting preferably has a diameter of about 0.9 to 10 times the thickness ($d_c$) of the insulating layer.

The invention claimed is:

1. A conductor board comprising:
   at least one layer (2) of ceramic areally provided on two mutual opposed faces with at least one metallization (3,4) each and having at least one through contacting (5) in the region of an aperture (6), metal foils forming said metallization being applied to said faces by means of direct copper bonding technique or by active soldering, said foils cover the at least one aperture (6), the metallization being electrical connected to each other through the aperture (6), wherein only one of the metallization (3,4) is permanently deformed so as to form an conical section (3') acting as a through contacting (5, 5a, 5b) in the region of the aperture (6) and extending into the aperture (6), and a tip of said section (3') is electrically connected to the other metallization (4) in the region of the aperture (6) by electrical welding.

2. Conductor board according to claim 1, wherein a body (9) of electrically conductive material is inserted into aperture (6), said body (9) having height (h) which is smaller than the thickness ($d_c$) of the layer (2), and at least one metallization (3) is so deformed that both metallization (3,4) lie in contact with the body (9) in the region of the aperture (6), and in that the metallization (3,4) are electrically connected to the body (9).

3. Conductor board according to claim 2, wherein the body (9) satisfies the following conditions:

$$h \leq d_c[(1+(a_1-a_2)\Delta T]+K.$$

wherein
   $d_c$ is the thickness of the layer (2);
   $a_1$ is the coefficient of thermal expansion of the material of the layer (2);
   $a_2$ is the coefficient of thermal expansion of the material of the inserted body (9);
   $\Delta T$ is the temperature difference between the maximum process temperature used in electrically connecting and room temperature;
   K is a correction factor.

4. Conductor board according to claim 3, wherein direct copper bonding is employed to apply metallization (3,4) to layer (2), and the correction factor K is equal to double the thickness of layer of the fusion zone occurring in the direct copper bonding.

5. Conductor board according to claim 3, wherein the correction factor K has a value of from 5 to 50 microns.

6. Conductor board according to claim 1, wherein one metallization (3) is so deformed in the region of the aperture (6) that it extends up to the other metallization (4).

7. Conductor board according to claim 1, wherein the deformation of the one metallization (3) is effected with a stamp (7, 7a, 7b).

8. Conductor board according to claim 1, wherein at least one metallization (3) is deformed in the manner of a hollow rivet or sleeve in the region of the aperture (6)

9. Conductor board according to claim 1, wherein at least one metallization (3) is deformed in the manner of a dish in the region of the aperture (6).

10. Conductor board according to claim 1, wherein the electrical connecting is effected by electric, ultrasonic and/or laser welding.

11. Conductor board according to claim 1, wherein the electrical connecting is effected with the aid of a direct bonding process or an active soldering process.

12. Conductor board according to claim 1, wherein the electrical connecting is effected using a solder.

13. Connector board according to claim 1, wherein the electrical connecting is effected using a conductive paste.

14. Conductor board according to claim 1, wherein the layer (2) has a thickness in the range between about 0.15and 2 mm.

15. Conductor board according to claim 1, wherein the metallization (3,4) are metal foils having a thickness $d_{cu}$ equivalent to about 0.2 to 1.0 times the thickness of the layer (2).

16. Conductor board according to claim 1, wherein the aperture (6) for the at least one through contacting (5, 5a, 5b, 5c) has a diameter of about 0.9 to 10 times the thickness (do) of the layer (2).

17. Conductor board comprising:
at least one layer (2) of a ceramic areally provided on two mutual opposed faces with at least one metallization (3,4) each, and having at least one through contacting in the region of an aperture (6), said metallization being formed by metal foils which cover the at least one aperture (6), a body (9) of electrically conductive material being inserted in the aperture (6) and electrically connected to the metallization (3,4), wherein the height (h) of the metal body (9) is smaller than the thickness (do) of the layer (2) of ceramic, and are at least one metallization (3) is conical deformed so that both metallization (3,4) are in contact with the body (9) in the region of the aperture (6). with the conical deformed metallization (3) having a tip which is connected to the body (9) by electrical welding.

18. Conductor board according to claim 17 wherein only one of the two metallization (3,4) is deformed.

19. A conductor board having at least one layer (2) of a dielectric provided on two mutually opposed faces with at least one metallization (3) each, and having at least one through contacting in the region of an aperture (6), metal foils being applied to said faces, which foils form the metallization and cover at least one aperture, a body (9) of electrically conductive material being inserted in the aperture (6) and electrically connected to the metallizations (3,4), wherein at least one metallization (3) is so deformed, that both metallization (3,4) lie in contact with the metal body (9) in the region of the aperture (6), and
wherein the metal body (9) inserted in the at least one aperture has a height (h) satisfying the following conditions:

$$h \ d_c[1+(a_1-a_2)\Delta T]+K$$

wherein
$d_c$ is the thickness of the layer (2) of the dielectric;.
$a_1$ is the coefficient of thermal expansion of the material of the layer (2) of the dielectric;
$a_2$ is the coefficient of thermal expansion of the material of the inserted body (9);
T is the temperature difference between the maximum process temperature used in electrically connecting and room temperature ;
K is a correction factor.

20. Conductor board according to claim 19, wherein only one of the metallization (3,4) is deformed.

21. Conductor board according to claim 19, wherein in application of the direct bonding process, the correction factor K is equal to double the thickness of layer of a fusion zone occurring in that process in between the layer of the dielectric and the metallization.

22. Conductor board according to claim 19, characterized in that the correction factor K has a value in the range between 5 to 50 microns.

23. Conductor board according to claim 19, wherein at least one metallization (3) is deformed in the manner of a dish in the region of the aperture (6).

24. Conductor board according to claim 19, wherein the electrical connecting is effected by electric, ultrasonic and/or laser welding.

25. Conductor board according to claim 19, wherein the electrical connecting is effected with the aid of a direct bonding process or an active soldering process.

26. Conductor board according to claim 19, wherein the electrical connecting is effected using a solder.

27. Conductor board according to claim 19, wherein the layer (2) of dielectric has a thickness in the range between about 0.15 and 2 mm.

28. Conductor board according to claim 19, wherein the metallization (3,4) are metal foils with a thickness $d_c$ equivalent to about 0.2 to 1.0 times the thickness of the layer (2) of dielectric.

29. Conductor board according to claim 19, wherein the aperture (6) for the at least one through contacting (5b) has a diameter of about 0.9 to 10 times the thickness ($d_c$) of the layer (2) of the dielectric.

30. Conductor board according to claim 19, wherein the layer (2) of the dielectric is a ceramic layer.

* * * * *